US008820095B2

(12) United States Patent
Lessig et al.

(10) Patent No.: US 8,820,095 B2
(45) Date of Patent: Sep. 2, 2014

(54) VORTEX-BASED TEMPERATURE CONTROL SYSTEM AND METHOD

(75) Inventors: Ken Lessig, Nevada, TX (US); Kevin Cronk, Murphy, TX (US); Brian O'Malley, Allen, TX (US); Matt Swain, Wylie, TX (US); Ramesh Sundaram, Fremont, CA (US)

(73) Assignee: Finisar Corporation, Sunnyvale, CA (US)

( * ) Notice: Subject to any disclaimer, the term of this patent is extended or adjusted under 35 U.S.C. 154(b) by 613 days.

(21) Appl. No.: 12/147,366

(22) Filed: Jun. 26, 2008

(65) Prior Publication Data

US 2009/0159715 A1 Jun. 25, 2009

Related U.S. Application Data

(60) Provisional application No. 61/008,985, filed on Dec. 21, 2007.

(51) Int. Cl.
  *F25B 9/02* (2006.01)
  *G05D 23/00* (2006.01)

(52) U.S. Cl.
  USPC .................................................. 62/5; 236/47

(58) Field of Classification Search
  USPC ..................... 62/5; 236/47; 355/30
  See application file for complete search history.

(56) References Cited

U.S. PATENT DOCUMENTS

| 3,630,272 | A  | * | 12/1971 | Kelly .............................. 60/676 |
| 4,925,089 | A  | * | 5/1990  | Chaparro et al. ........... 236/78 D |
| 6,032,724 | A  | * | 3/2000  | Hatta ........................... 165/80.2 |
| 6,108,206 | A  | * | 8/2000  | Criniti et al. .................. 361/704 |
| 6,401,463 | B1 | * | 6/2002  | Dukhan et al. ..................... 62/5 |
| 2005/0257533 | A1 | * | 11/2005 | Gunawardana et al. ............ 62/5 |
| 2005/0267645 | A1 | * | 12/2005 | Fenk ............................. 700/300 |
| 2006/0244472 | A1 | * | 11/2006 | Hayashi et al. ............... 324/760 |
| 2007/0209370 | A1 | * | 9/2007  | Broerman et al. .................. 62/5 |
| 2008/0136068 | A1 | * | 6/2008  | Leone ........................... 264/520 |

FOREIGN PATENT DOCUMENTS

| JP | 07042973 A | * | 2/1995 |
| JP | 09196816 A | * | 7/1997 |
| JP | 2000074801 A | * | 3/2000 |

* cited by examiner

*Primary Examiner* — Chen Wen Jiang
(74) *Attorney, Agent, or Firm* — Maschoff Brennan

(57) ABSTRACT

A vortex-based temperature control system comprises a test chamber configured to receive a test article therein, a sensor disposed within the test chamber for detecting a temperature within the test chamber, a first vortex tube coupled to the test chamber for providing a heating airflow to the test chamber, and a second vortex tube coupled to the test chamber for providing a cooling airflow to the test chamber. The system also comprises a temperature controller coupled to the sensor and configured to control an airflow delivered to the first and second vortex tubes to obtain a desired temperature setting within the test chamber.

22 Claims, 8 Drawing Sheets

VORTEX-BASED TEMPERATURE CONTROL SYSTEM AND METHOD

CROSS-REFERENCE TO RELATED APPLICATIONS

The present application claims the benefit of U.S. Provisional Patent Application No. 61/008,985, filed on Dec. 21, 2007, the entire disclosure of which is incorporated herein by reference for all purposes.

BACKGROUND

Different types of devices are subject to temperature variations within their operating environment. Accordingly, these devices are often tested over different temperature ranges to validate their performance characteristics. For example, the device may be placed in an enclosure and tested/operated over a variety of different temperatures. Temperature control of the enclosure is generally performed by heating coil and/or refrigeration-type (condenser/evaporator) control components.

DETAILED DESCRIPTION OF THE DRAWINGS

Figure 1:
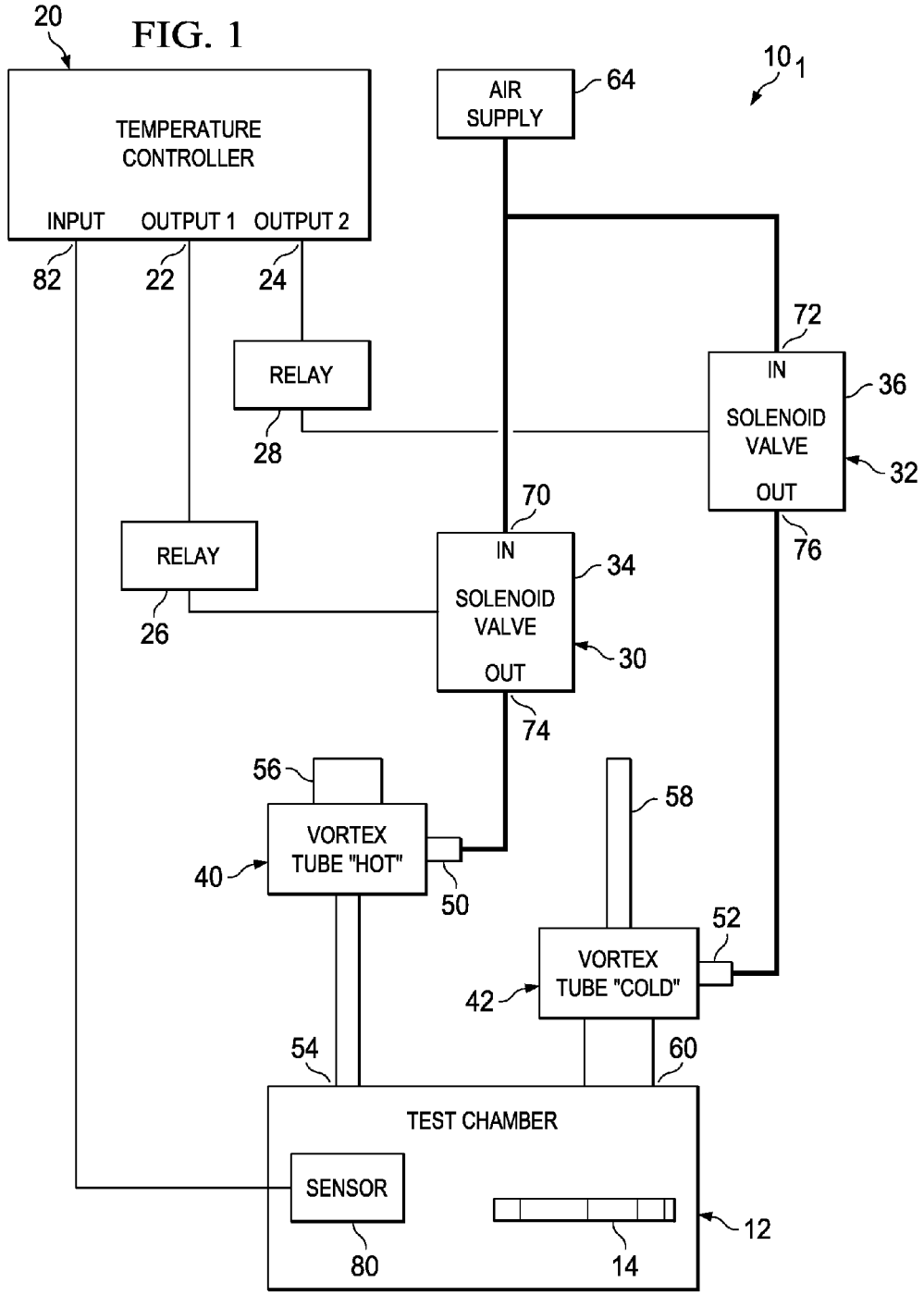
FIG. 1 is a diagram illustrating an embodiment of a vortex-based temperature control system.

FIG. 1 is a diagram illustrating an embodiment of a vortex-based temperature control system $10_1$. In the illustrated embodiment, system $10_1$ comprises a test chamber 12 where an article 14 to be tested is located. Test article 14 may comprise any type of component desired to be tested at varying temperatures (e.g., temperatures above and/or below an ambient temperature) such as an optical transceiver, a vertical cavity surface emitting laser, or other optical or non-optical device. Test article 14 may be operatively coupled to a printed circuit board and/or otherwise supported within test chamber 12. For example, in some embodiments, various types of electrical, mechanical and/or communication mediums may be operatively coupled to test article 14 while test article 14 is within test chamber 12 to enable the operation of test article 14 within test chamber 14 and the gathering of data relating to the operation and/or testing of test article 14. Test chamber 12 may comprise any type of housing and/or structure for at least partially enclosing test article 14 therein to enable a controlled temperature environment for test article 14. In some embodiments, test chamber 12 enables at least a portion of an airflow therethrough to enable the introduction of additional airflow for regulating the temperature within test chamber 12.

In the embodiment illustrated in FIG. 1, system $10_1$ also comprises a temperature controller 20 having a pair of outputs 22 and 24 communicatively coupled to respective relays 26 and 28, which in turn are communicatively coupled to a respective airflow control device 30 and 32. In some embodiments, airflow control devices 30 and 32 comprise solenoid valves 34 and 36, respectively. However, it should be understood that other types of airflow control devices may be used. Airflow control devices 30 and 32 are each operatively coupled to a respective vortex tube 40 and 42 for airflow communication therewith. For example, vortex tubes 40 and 42 each comprise an airflow inlet 50 and 52 and a pair of oppositely disposed airflow outlets 54, 56, 58 and 60, respectively. An air supply 64, which may comprise a source of compressed or pressurized air, is operatively coupled to an airflow inlet 70 and 72 of respective airflow control devices 30 and 32, and an airflow outlet 74 and 76 of respective airflow control devices 30 and 32 are each operatively coupled to respective airflow inlets 50 and 52 of vortex tubes 40 and 42. Thus, in operation, air supply 64 provides a pressurized airflow to airflow control devices 30 and 32 which, in turn, control and supply an airflow to respective vortex tubes 40 and 42. It should be understood that the "airflow" and/or "air supply" may comprise any type of gas.

Temperature controller 20 may comprise a general purpose computer or other type of processor-based computing and/or control system. For example, in some embodiments, temperature controller 20 may comprise a processor that serves to execute instructions for software that may be loaded into a memory or other type of persistent storage device thereof or otherwise accessible by temperature controller 20 (e.g., a hard drive, a flash memory, a rewritable optical disk, a rewritable magnetic tape, or some combination of the foregoing). Instructions and data for temperature controller may be loaded into a memory thereof for execution by processor unit of temperature controller 20. These instructions are referred to as program code, computer-usable program code, or computer-readable program code that may be read and executed by a processor unit of temperature controller 20. The program code in the different embodiments may be embodied on different physical or tangible computer-readable media such as, but not limited to, an optical or magnetic disc that is inserted or placed into a drive or other device that is part of temperature controller 20 or connected to temperature controller 20. Computer-readable media may also take the form of a persistent storage such as a hard drive, a thumb drive, or a flash memory that is connected to temperature controller 20.

Each vortex tube 40 and 42 is configured to generate an internal airflow vortex (e.g., within a swirl chamber of the vortex tube) that separates the airflow therein into heated and cooled airflow streams. For example, in some embodiments, vortex tubes 40 and 42 comprise a conical nozzle located near respective airflow outlets 54 and 58 such that an outer shell of the swirling airflow (i.e., the heated airflow) exits the tube at airflow outlets 54 and 58 while the inner shell of the swirling airflow (i.e., the cooled airflow) returns in an inner vortex of reduced diameter and exits airflow outlets 56 and 60 of respective vortex tubes 40 and 42. Thus, in the embodiment illustrated in FIG. 1, airflow outlet 54 of vortex tube 40 is operatively coupled to test chamber 12 to provide a heated airflow to an internal area of test chamber 12, and airflow outlet 60 of vortex tube 42 is operatively coupled to test chamber 12 to provide a cooled airflow to an internal area of test chamber 12.

In the embodiment illustrated in FIG. 1, system $10_1$ also comprises a sensor 80 (e.g., in the form of a thermocouple or other type of temperature-sensing mechanism) located within test chamber 12 and communicatively coupled to an input 82 of temperature controller 20 to enable temperature monitoring and control by temperature controller 20. Sensor 80 may be coupled directly to test article 14, coupled to a printed circuit board onto which test article 14 is mounted, or otherwise positioned within the test chamber 12.

Thus, in operation, temperature controller 20 uses and/or otherwise analyzes signals received from sensor 80 to dynamically and/or responsively control the flow of air to vortex tube 40 and/or 42. For example, in some embodiments, temperature controller 20 actuates/de-actuates solenoid valves 34 and 36 to control/regulate airflow to vortex tubes 40 and 42 to obtain a desired temperature setting within test chamber 12. For example, to increase the temperature within test chamber 12, temperature controller 20 actuates/de-actuates solenoid valves 34 and 36 to provide/increase an airflow delivered to vortex tube 40 (i.e., the "hot" vortex tube) and/or cessate/decrease an airflow to vortex tube 42 (i.e., the "cold" vortex tube). Vortex tubes 40 and 42 may be used independently (e.g., providing an airflow to either the "hot" vortex tube 40 or the "cold" vortex tube" 42) or used in combination (e.g., providing a proportional airflow to both the "hot" and "cold" vortex tubes 40 and 42 concurrently), thereby enabling greater temperature stability within test chamber 12 and the dynamic adjustment of the temperature within test chamber 12 based on readings of sensor 80.

Thus, in an "on-off" mode of operation, temperature controller 20 turns on an airflow to a particular vortex tube 40 and/or 42 by controlling airflow control devices 30 and/or 32 to achieve a desired temperature setpoint within test chamber 12. In some embodiments, temperature controller 20 energizes a particular relay 26 and/or 28 to enable an airflow through a corresponding solenoid valve 34 and 36. In this mode of operation, the airflow may be delivered to the particular vortex tube 40 and/or 42 until a desired setpoint is reached. In some embodiments, temperature controller 20 comprises a PID-capable temperature controller 20, thereby enabling a proportional ramp rate of temperature control to minimize overshoot within test chamber 12. As used herein, a "PID"-capable temperature controller refers to a proportional-integral-derivative controller using a loop feedback mechanism and/or algorithm to compensate for any error between a measured process variable (e.g., the temperature within test chamber 12) and a desired temperature setpoint. The feedback mechanism may comprise logic, circuitry and/or a set of executable instructions embodied in software, firmware, hardware, or a combination thereof. The control parameters used by temperature controller 20 to control the airflow to vortex tubes 40 and/or 42 may be located in temperature controller 20 or may reside in another computing platform in communication with temperature controller 20. It should also be understood that a desired setpoint temperature (or desired temperature range) may be input to temperature controller 20 via an input device (such as a keyboard, keypad, mouse, touchscreen, or other type of input mechanism), communicated to temperature controller 20 from another computing platform, read from a table or other type of data file, or otherwise.

Figure 2:
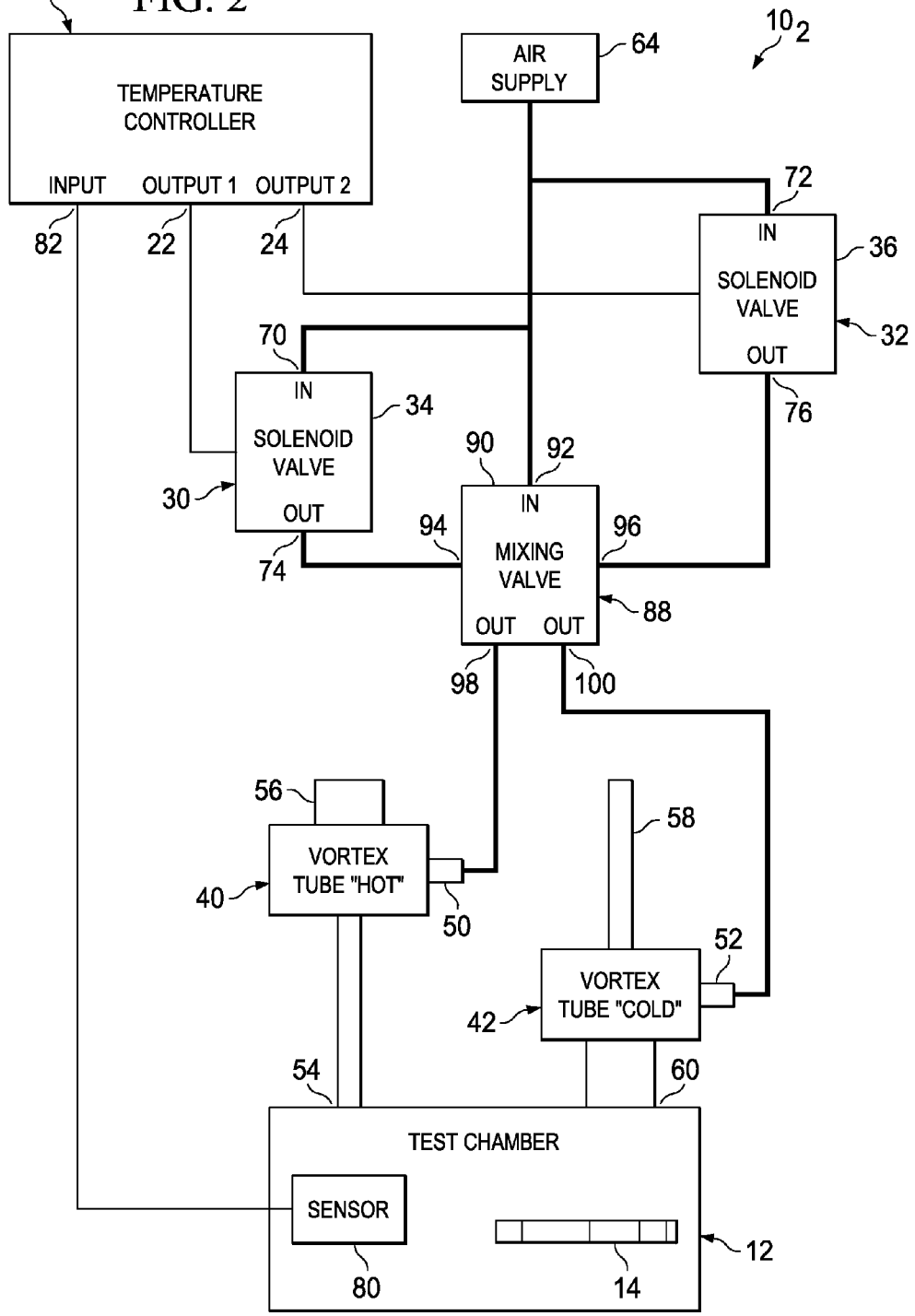
FIG. 2 is a diagram illustrating another embodiment of a vortex-based temperature control system.

FIG. 2 is a diagram illustrating another embodiment of vortex-based temperature control system $10_2$. In the embodiment illustrated in FIG. 2, system $10_2$ comprises test chamber 12, temperature controller 20, vortex tubes 40 and 42, and airflow control devices 30 and 32 in the form of solenoid valves 34 and 36, respectively. In this embodiment, system $10_2$ also comprises an airflow control device 88 in the form of a mixing valve 90 for controlling the airflow provided to vortex tubes 40 and/or 42. For example, in this embodiment, air supply 64 is operatively coupled to airflow inlets 70 and 72 of solenoid valves 34 and 36, respectively, and an airflow inlet 92 of mixing valve 90 to provide an airflow thereto. Airflow outlets 74 and 76 of valves 34 and 36 are operatively coupled to respective airflow inlets 94 and 96 of mixing valve 90. Airflow outlets 98 and 100 of mixing valve 90 are operatively coupled to respective vortex tubes 40 and 42.

In operation, temperature controller 20 actuates/de-actuates solenoid valves 34 and 36 to control airflow to respective airflow inlets 94 and 96 of mixing valve 90. In some embodiments, mixing valve 90 comprises an internal air-actuatable mechanism for varying and/or otherwise controlling the airflow output via airflow outlets 98 and 100. For example, in some embodiments, actuation of a particular solenoid valve 30 and/or 32 causes an airflow to be delivered to mixing valve 90 from the actuated solenoid valve 30 and/or 32 which, in turn, actuates mixing valve 90 to cause a desired airflow to be provided to a particular vortex tube 40 and/or 42 via airflow outlets 98 and 100. Thus, in operation, temperature controller 20 controls actuation of airflow control devices 30 and/or 32 which, in turn, control actuation of mixing valve 90 to deliver a desired airflow to vortex tube 40 and/or 42 via airflow outlets 98 and/or 100 of mixing valve 90 to obtain a desired temperature within test chamber 12. As discussed above, feedback from sensor 80 is used by temperature controller 20 to monitor and/or adjust the airflow delivered to airflow control devices 30 and 32 to thereby adjust the temperature within test chamber 12. As described above, a PID-capable temperature controller 20 may be used to provide a proportional ramp rate of temperature control for test chamber 12. Further, in the embodiment illustrated in FIG. 2, relays 26 and 28 (FIG. 1) are omitted. In the embodiment illustrated in FIG. 2, mixing valve 90 is controlled using an airflow provided via solenoid valves 34 and/or 36. However, it should be understood that that other types of mixing valves and, accordingly, other types of control devices may be used to control operation of mixing valve 90 to regulate the airflow to vortex tubes 40 and/or 42.

Figure 3:
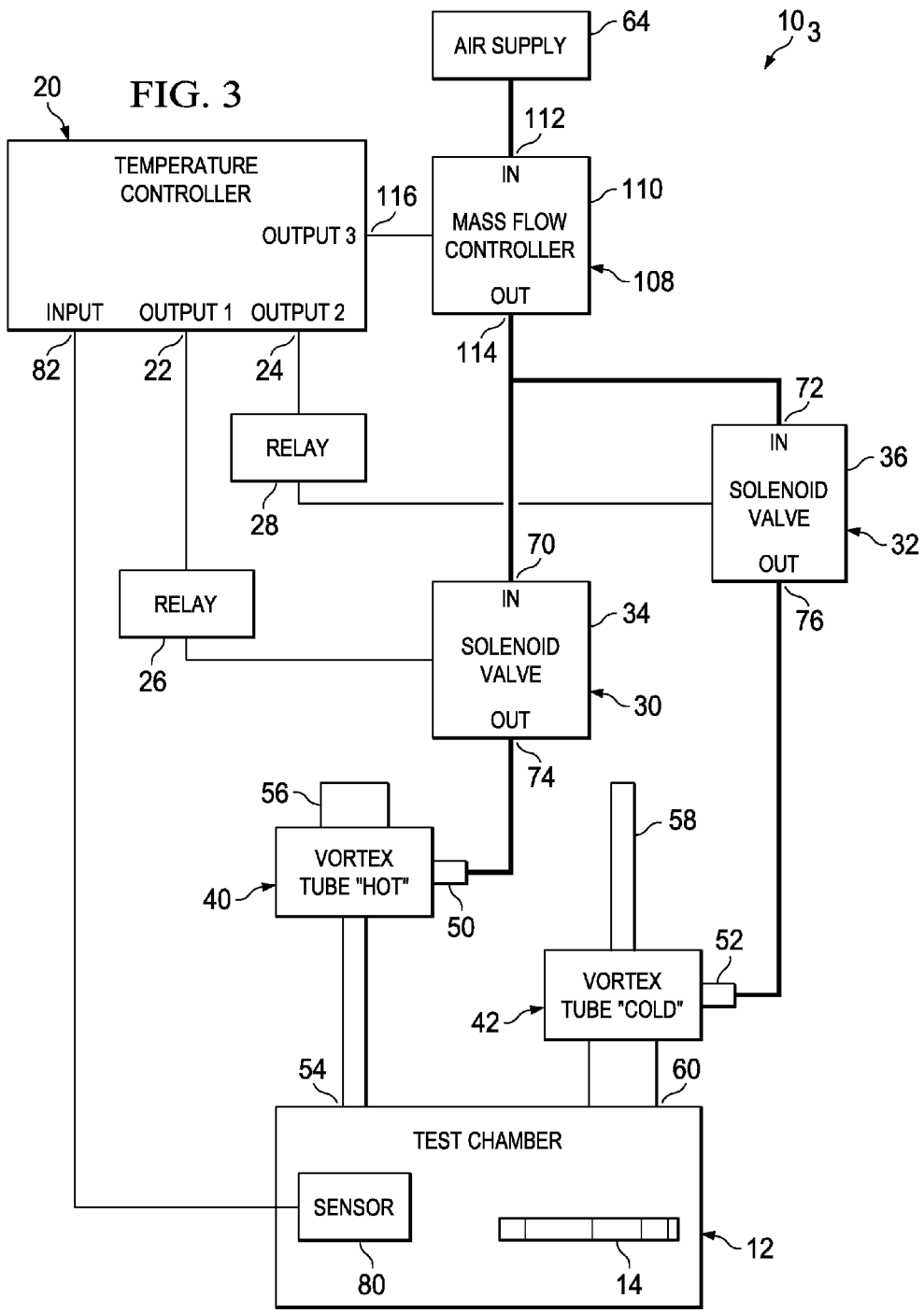
FIG. 3 is a diagram illustrating another embodiment of a vortex-based temperature control system.

FIG. 3 is a diagram illustrating another embodiment of vortex-based temperature control system $10_3$. In the embodiment illustrated in FIG. 3, system $10_3$ comprises test chamber 12, temperature controller 20, relays 26 and 28, vortex tubes 40 and 42, and airflow control devices 30 and 32 in the form of solenoid valves 34 and 36, respectively. In this embodiment, system $10_3$ also comprises an airflow control device 108 in the form of a mass flow controller 110 to control the airflow deliverable to vortex tubes 40 and 42. For example, in the illustrated embodiment, air supply 64 is operatively coupled to an airflow inlet 112 of mass flow controller 110, and an airflow outlet 114 of mass flow controller 110 is coupled to airflow inlets 70 and 72 of respective solenoid valves 34 and 36. Mass flow controller 110 is also communicatively coupled to an output 116 of temperature controller 20. In the embodiment illustrated in FIG. 3, temperature controller 20 "tunes" and/or otherwise controls mass flow controller 110 to vary the airflow rate delivered to vortex tubes 40 and 42 via respective airflow control devices 30 and 32. For example, full (or a generally high airflow volume) enables rapid temperature change, and as the temperature within test chamber 12 nears a desired setpoint, the airflow can be reduced to avoid overshoot. Thus, in this embodiment, temperature controller 20 uses feedback based on readings of data acquired and/or otherwise provided by sensor 80 to control mass flow controller 110 to vary an airflow rate delivered to airflow control devices 30 and/or 32, thereby controlling the rate of temperature change within test chamber 12. As described above, a PID-capable temperature controller 20 may also be used to provide a proportional ramp rate of temperature control for test chamber 12.

Figure 4:
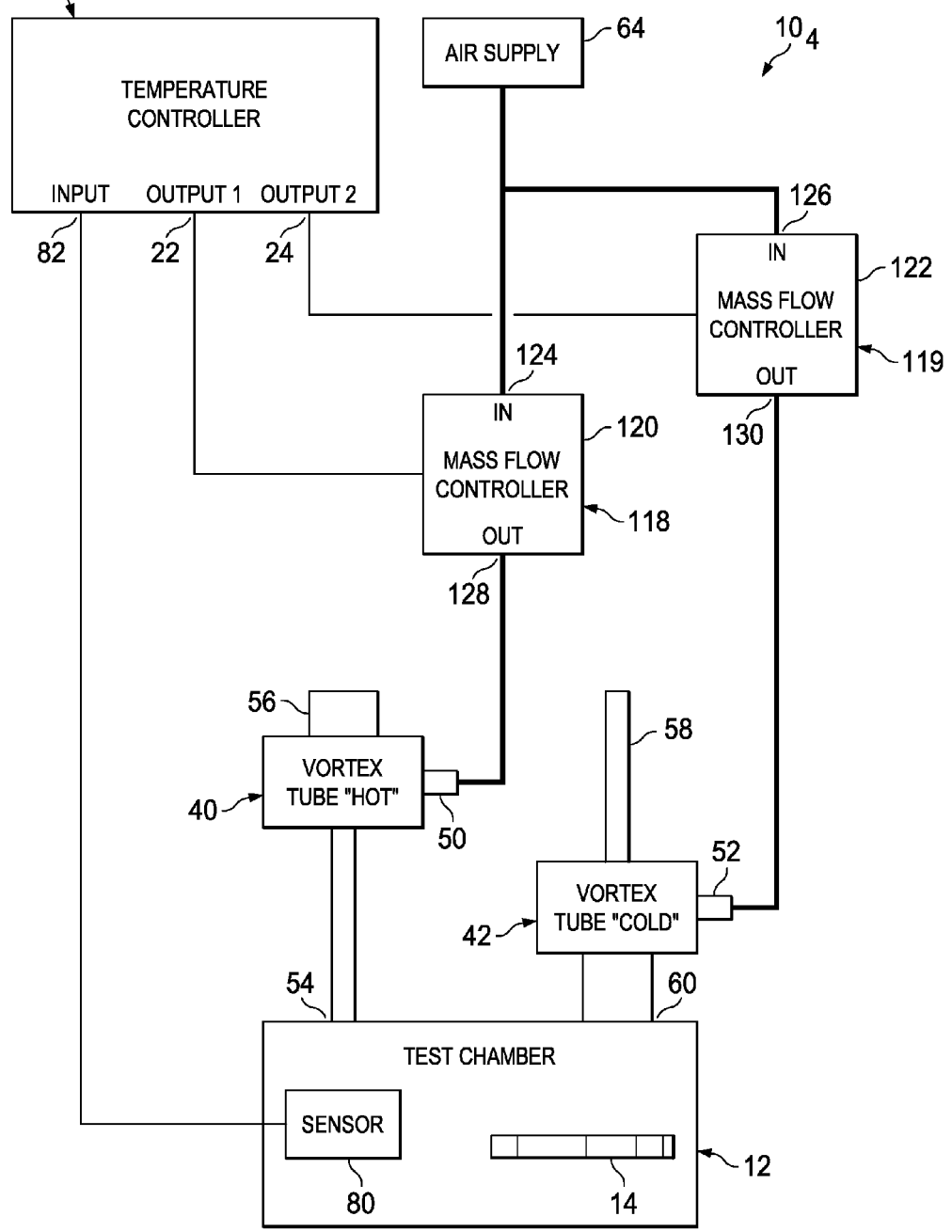
FIG. 4 is a diagram illustrating another embodiment of a vortex-based temperature control system.

FIG. 4 is a diagram illustrating another embodiment of vortex-based temperature control system $10_4$. In the embodiment illustrated in FIG. 4, system $10_4$ comprises test chamber 12, temperature controller 20, vortex tubes 40 and 42. In this embodiment, system $10_4$ also comprises airflow control devices 118 and 119 in the form of mass flow controllers 120 and 122, respectively, coupled to respective outputs 22 and 24 of temperature controller 20. Further, air supply 64 is operatively coupled to airflow inlets 124 and 126 of respective mass flow controllers 120 and 122, and airflow outlets 128 and 130 of mass flow controllers 120 and 122 are operatively coupled to airflow inlets 50 and 52 of vortex tubes 40 and 42, respectively. In this embodiment, in operation, mass flow controllers 120 and 122 control the rate of airflow delivered to respective vortex tubes 40 and 42, thereby controlling an output temperature of the respective vortex tubes 40 and 42. Thus, in this embodiment, outputs 22 and 24 of temperature controller 20 are used in a proportional mode to control the rate of airflow delivered to vortex tubes 40 and 42 via mass flow controllers 120 and 122, thereby enabling a smooth airflow delivery to vortex tubes 40 and/or 42 instead of an "on-off" mode of operation as discussed above in connection with FIG. 1, for example. As described above, a PID-capable temperature controller 20 may also be used to provide a proportional ramp rate of temperature control for test chamber 12.

Figure 5:
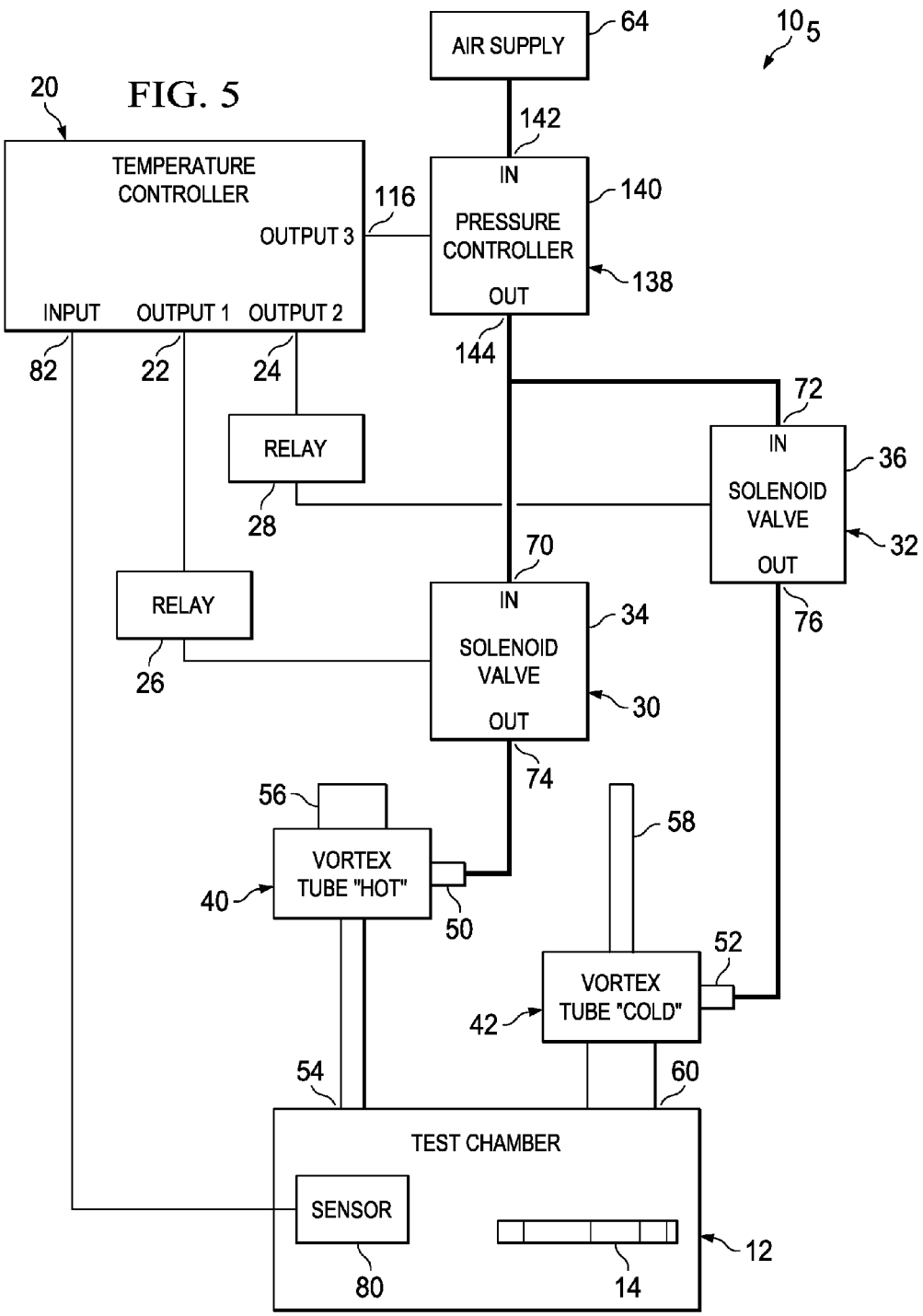
FIG. 5 is a diagram illustrating another embodiment of a vortex-based temperature control system.

FIG. 5 is a diagram illustrating another embodiment of vortex-based temperature control system $10_5$. In the embodiment illustrated in FIG. 5, system $10_5$ comprises test chamber 12, temperature controller 20, airflow control devices 30 and 32 in the form of solenoid valves 34 and 36, respectively, and vortex tubes 40 and 42. In this embodiment, system $10_5$ also comprises an airflow control device 138 in the form of a pressure controller 140 to control a volume of airflow deliverable to vortex tubes 40 and 42. For example, in the illustrated embodiment, air supply 64 is operatively coupled to an airflow inlet 142 of pressure controller 140, and an airflow outlet 144 of pressure controller 140 is operatively coupled to airflow inlets 70 and 72 of respective solenoid valves 34 and 36. Pressure controller 140 is also communicatively coupled to output 116 of temperature controller 20. In operation, temperature controller 20 controls the airflow delivered to vortex tubes 40 and 42 by controlling and/or adjusting pressure controller 140. As described above, a PID-capable temperature controller 20 may also be used to provide a proportional ramp rate of temperature control for test chamber 12.

Figure 6:
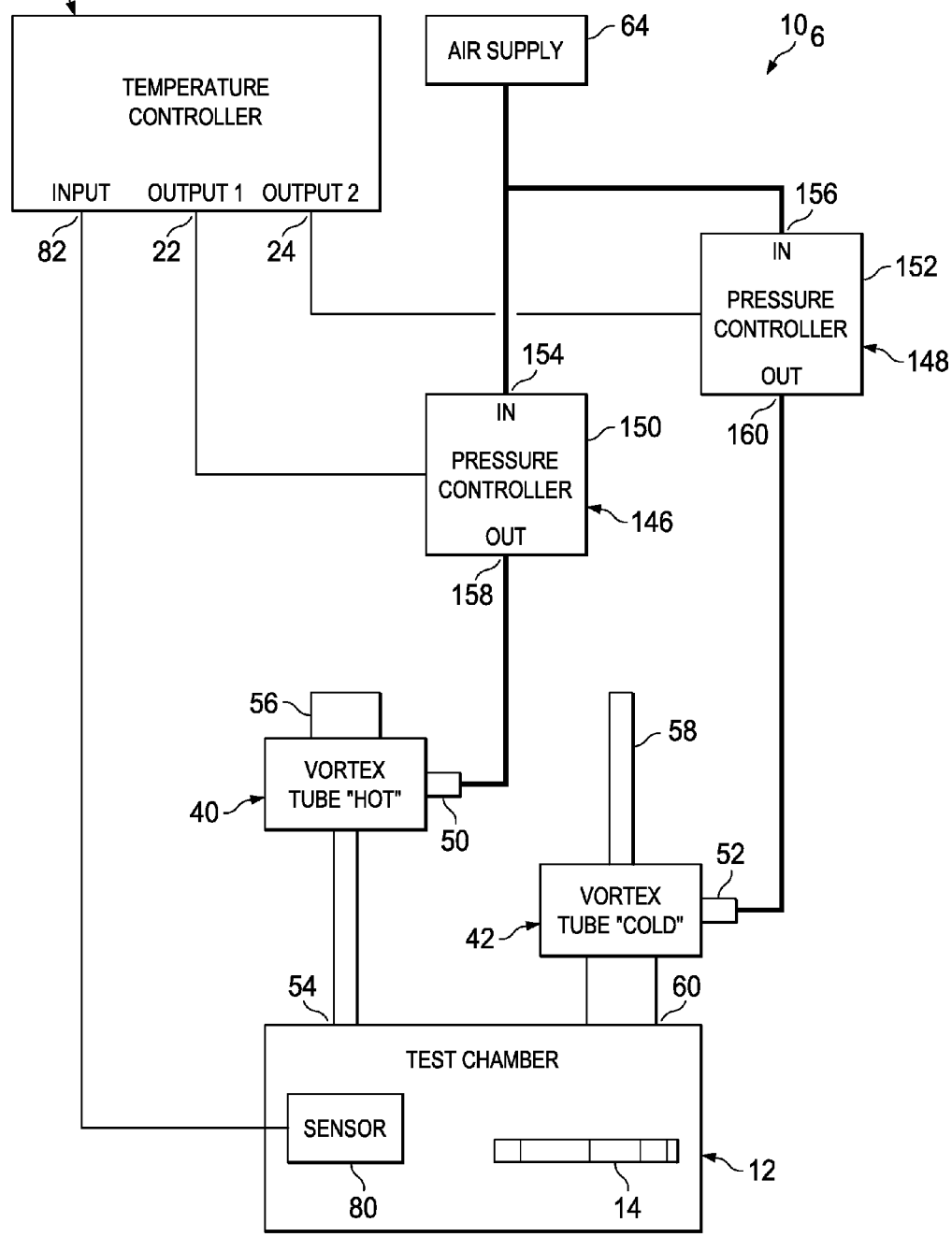
FIG. 6 is a diagram illustrating another embodiment of a vortex-based temperature control system.

FIG. 6 is a diagram illustrating another embodiment of vortex-based temperature control system $10_6$. In the embodiment illustrated in FIG. 6, system $10_6$ comprises test chamber 12, temperature controller 20, and vortex tubes 40 and 42. In this embodiment, system $10_6$ also comprises airflow control devise 146 and 148 in the form of pressure controllers 150 and 152, respectively, coupled to respective outputs 22 and 24 of temperature controller 20 to control a volume of airflow deliverable to vortex tubes 40 and 42. For example, in this embodiment, air supply 64 is operatively coupled to respective airflow inlets 154 and 156 of pressure controllers 150 and 152, and respective airflow outlets 158 and 160 of pressure controllers 150 and 152 are operatively coupled to respective airflow inlets 50 and 52 of vortex tubes 40 and 42. In operation, temperature controller 20 controls and/or otherwise adjusts pressure controllers 150 and 152 to control the volume of airflow delivered to vortex tubes 40 and 42. As described above, a PID-capable temperature controller 20 may also be used to provide a proportional ramp rate of temperature control for test chamber 12.

Figure 7:
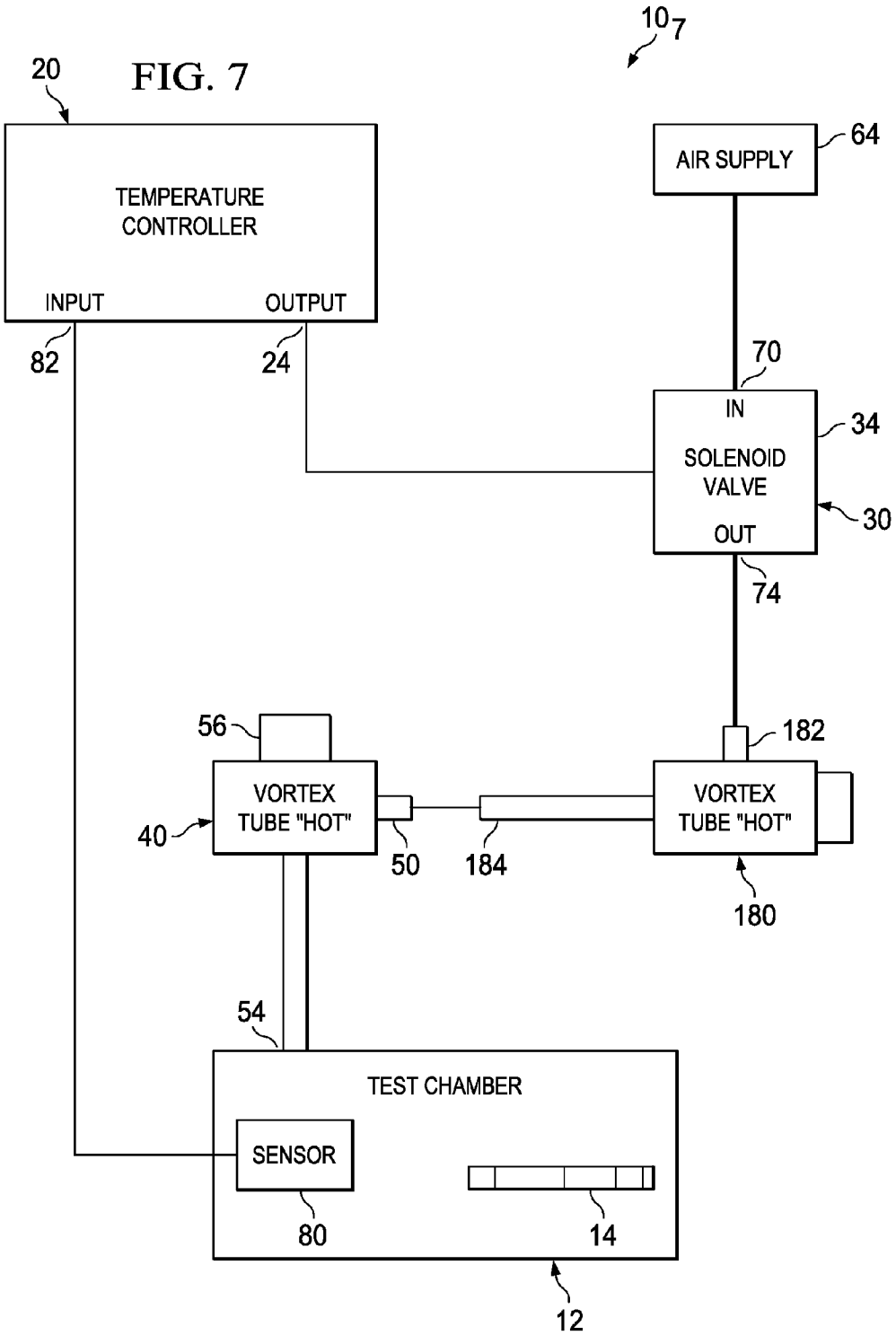
FIG. 7 is a diagram illustrating another embodiment of a vortex-based temperature control system.

FIG. 7 is a diagram illustrating another embodiment of vortex-based temperature control system $10_7$. In the embodiment illustrated in FIG. 7, system $10_7$ comprises a plurality of serially connected vortex tubes to enable greater temperature extremes for testing and/or operating test article 14 within test chamber 12. For example, in the embodiment illustrated in FIG. 7, system $10_7$ comprises test chamber 12, temperature controller 20, vortex tube 40, and airflow control device 30 in the form of solenoid valve 34. In this embodiment, system $10_7$ also comprises a vortex tube 180 serially coupled to vortex tube 40. For example, in this embodiment, an airflow inlet 182 of vortex tube 180 is operatively coupled to airflow outlet 74 of solenoid valve 34. An airflow outlet 184 of vortex tube 180 (i.e., the "hot" outlet) is operatively coupled to airflow inlet 50 of vortex tube 40. In operation, temperature controller 20 controls airflow control device 30 (e.g., solenoid valve 34) to regulate an airflow delivered to airflow inlet 182 of vortex tube 180. Airflow outlet 184 of vortex tube 180 delivers the heated airflow from vortex tube 180 to airflow inlet 50 of vortex tube 40, thereby resulting in an additional temperature increase of the airflow by vortex tube 40 before the airflow is delivered to test chamber 12. Accordingly, the embodiment of system $10_7$ illustrated in FIG. 7 enables greater temperature extremes to be obtained for test chamber 12. In FIG. 7, vortex tubes 40 and 180 are configured to provide an elevated or above-ambient temperature airflow to test chamber 12; however, it should be understood that the inlets/outlets connected between vortex tubes and test chamber 12 may be changed to enable a decreased or sub-ambient temperature airflow to test chamber 12. As described above, a PID-capable temperature controller 20 may also be used to provide a proportional ramp rate of temperature control for test chamber 12.

Figure 8:
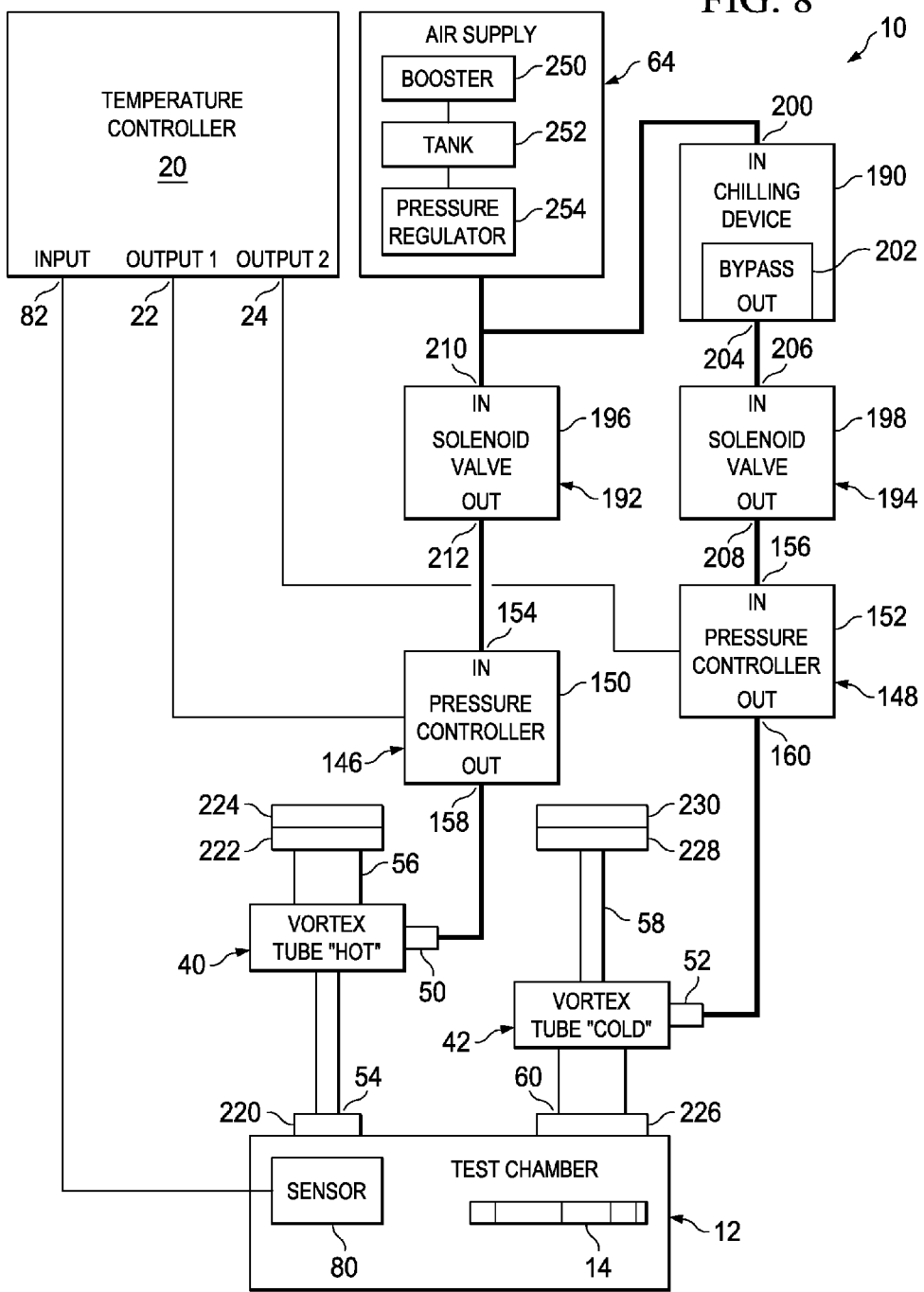
FIG. 8 is a diagram illustrating another embodiment of a vortex-based temperature control system.

FIG. 8 is a diagram illustrating another embodiment of vortex-based temperature control system $10_8$. In the embodiment illustrated in FIG. 8, system $10_8$ comprises test chamber 12, temperature controller 20, vortex tubes 40 and 42, and airflow control devices 146 and 148 in the form of pressure controllers 150 and 152, respectively. In this embodiment, system $10_8$ also comprises a chilling device 190 and airflow control devices 192 and 194 in the form of solenoid valves 196 and 198, respectively. Chilling device 190 is used to reduce a temperature of an airflow deliverable to "cold" vortex tube 42, thereby enabling an increased reduction in the temperature of the airflow output by vortex tube 42 to test chamber 12. For example, in the embodiment illustrated in FIG. 8, air supply 64 is operatively coupled to an inlet 200 of chilling device 190. In this embodiment, chilling device 190 comprises a cold airflow bypass 202 having an outlet 204 coupled to an inlet 206 of solenoid valve 198. An outlet 208 of solenoid valve 198 is operatively coupled to inlet 156 of pressure controller 148. Further, air supply 64 is operatively coupled to an inlet 210 of solenoid valve 196, and an outlet 212 of solenoid valve 196 is operatively coupled to inlet 154 of pressure controller 146. In some embodiments, chilling device 190 comprises a compressed air dryer and/or refrigerated air dryer/cooler that removes moisture from the compressed airflow and bypasses and/or outputs cooled airflow, thereby reducing a temperature of the airflow delivered to vortex tube 42. Thus, in operation, chilling device 190 is located upstream along an airflow path from vortex tube 42 to reduce a temperature of the airflow before reaching vortex tube, thereby enabling Solenoid valves 196 and 198 may be electrically and/or communicatively coupled to temperature controller 20 to enable control of solenoid valves 196 and 198 by temperature controller 20. However, it should be understood that solenoid valves 196 and/or 198 may be coupled to another power supply/controller source. In this embodiment, solenoid valves 196 and 198 are configured to be in a closed state in the absence of power. For example, in this embodiment, in the event of a loss of power or a malfunction of temperature controller 20, solenoid valves 196 and 198 are automatically closed, thereby ceasing the delivery of an airflow to vortex tubes 40 and/or 42 and test chamber 12.

In FIG. 8, system $10_8$ also comprises a muffler 220 coupled to outlet 54 of vortex tube 40, and mufflers 222 and 224 serially coupled together and coupled to outlet 56 of vortex tube 40. System $10_8$ also comprises a muffler 226 coupled to outlet 60 of vortex tube 42, and mufflers 228 and 230 serially coupled together and coupled to outlet 58 of vortex tube 42. Mufflers 220, 222, 224, 226, 228 and 230 may comprise any type of device for reducing the level of sound associated with vortex tubes 40 and/or 42. Mufflers 220, 222, 224, 226, 228 and 230 may be configured alike or may be configured differently. For example, in some embodiments, to reduce the amount of temperature change in the airflow passing through a muffler, mufflers 220 and/or 226 may be configured from polystyrene or another material(s) having low thermal absorption/transfer properties. It should also be understood that the quantity of mufflers at an outlet of vortex tubes 40 and/or 42 may be varied (e.g., to reduce thermal loss, a single muffler may be used at the outlet of a vortex tube into test chamber 12; however, additional mufflers may be used). Further, it should be understood that sound-insulating material may be added to and/or incorporated into test chamber 12.

In the embodiment illustrated in FIG. 8, air supply 64 comprises a booster 250 for increasing a pressure of an air supply/airflow deliverable to vortex tubes 40 and/or 42, a capacity tank 252 for storing the pressurized gas, and a pressure regulator 254. In some embodiments, booster 250 comprises a passive booster for increasing the pressure of the gas; however, it should be understood that other types of devices or combinations of devices may be used to increase and/or otherwise control the pressure of the gas delivered to vortex tubes 40 and/or 42 (e.g., one or more of a compressor, filter/cleaner, dryer, etc.). Thus, in the embodiment illustrated in FIG. 8, the airflow delivered to booster 250 is increased in pressure by booster 250 and stored in tank 252. Pressure regulator 254 is used to control the pressure of the airflow released downstream to vortex tubes 40 and/or 42. Thus, in the illustrated embodiment, if the pressure of the gas received by booster 250 is approximately 70 psi, booster 250 may be used to increase the pressure to, for example, 140 psi. Pressure regulator 254 may be used to control an output pressure of the airflow delivered downstream to, for example, 125 psi, which is then passed downstream to chilling device 190. Thus, embodiments of system 10 enable control of pressure and/or temperature of the airflow, and in some embodiments in combination with a chilling device, to enable significant temperature reductions to airflow delivered to test chamber 12. It should be understood that various components illustrated in system $10_8$ may be used in different combinations. For example, in some embodiments, booster 250, tank 252 and pressure regulator 254 may be used without chilling device 90. In some embodiments, chilling device 90 may be used without booster 250, tank 252 and pressure regulator 254. In yet other embodiments, chilling device 90 may be used, alternately or additionally to the embodiment illustrated in FIG. 8, in connection with "hot" vortex tube 40 (e.g., to deliver an airflow to the "hot" vortex tube 40 at a desired temperature to enable control of the output temperature of the airflow by vortex tube 40).

Thus, in operation, temperature controller 20 reads and/or otherwise receives/determines a particular temperature setpoint for test chamber 12 for a particular test article 14. Temperature controller 20 controls airflow delivered to vortex tubes 40, 42 and/or 180 to obtain the indicated temperature setpoint within test chamber 12. For example, in some embodiments, in response to feedback signals received from sensor 80, temperature controller 20 manipulates and/or otherwise adjusts various airflow control devices to control the airflow delivered to vortex tubes 40, 42 and/or 180. In some embodiments, temperature controller 20 actuates/de-actuates solenoid valves 34 and/or 36 to regulate the airflow delivered to vortex tubes 40, 42 and/or 180. In some embodiments, temperature controller 20 controls mass flow controllers 110, 120 and/or 122 to regulate the airflow delivered to vortex tubes 40, 42 and/or 180. Additionally, in some embodiments, temperature controller 20 controls pressure controller 140, 146 and/or 148 to regulate the airflow delivered to vortex tubes 40, 42 and/or 180. In yet other embodiments, temperature controller 20 controls the operation of mixing valve 90 to control the airflow delivered to vortex tubes 40, 42 and/or 180. Thus, various embodiments of system 10 (e.g., systems $10_1$-$10_8$) use a controlled airflow in combination with one or more vortex tubes (e.g., vortex tubes 40, 42 and/or 180) to reduce and/or elevate a temperature within test chamber 12. Various embodiments of the present invention control the supply of an airflow to a particular vortex tube (e.g., airflow "on" or airflow "off"), control/regulate an airflow rate to vortex tube(s), and/or control/regulate an airflow volume delivered to vortex tube(s) to obtain a desired temperature setpoint or temperature profile within test chamber 12. It should be understood that the quantity of vortex tubes and the types of airflow control devices used to control airflow to the vortex tube(s) may be varied, combined, and/or otherwise modified. For example, it should be understood that multiple, serially-connected vortex tubes, one or more chilling devices, and/or various air supply temperature/pressure control devices may be used in any of the embodiments illustrated in FIGS. 1-8. It should also be understood that to obtain a stable temperature setpoint or temperature profile particularly close to ambient temperature, a method of mixing above and below ambient airstreams, prior to entry into test chamber 12, may be performed. Thus, in some embodiments, "hot" and "cold" airflow streams may be provided to test chamber 12 via vortex tubes 40 and 42 simultaneously or on/off intermittently/alternately to enable measurements or test data to be acquired for test article 14 at or near an ambient temperature and subsequently enabling control of the "hot" and/or "cold" airflow streams (e.g., via a mixing valve, solenoid valves, etc.) to elevate or reduce the temperature within test chamber 12 relative to ambient to enable the acquisition of test data and/or measurements associated with test article 14 at various temperature settings and/or profiles. It should also be understood that even at an elevated temperature (i.e., elevated above an ambient temperature), a "cold" airflow stream may be simultaneously delivered to test chamber 12 with a "hot" airflow to enable temperature regulation (and vice versa at below ambient temperatures).

Thus, embodiments of vortex-based temperature control system 10 enable less energy usage than conventional heating coil and/or refrigeration-type temperature control components. Embodiments of vortex-based temperature control system 10 also require less space than conventional heating coil and/or refrigeration-type temperature control components and costs significantly less in both acquisition costs and operating costs. Further, embodiments of vortex-based temperature control system 10 enable testing of test article 14 over a range of temperatures below and above an ambient temperature without removal of test article 14 from test chamber 12 and/or opening of test chamber 12. For example, in embodiments comprising at least one vortex tube connected to test chamber 12 to provide a cooling airflow to test chamber 12 and at least one vortex tube connected to test chamber 12 to provide a heating airflow to test chamber 12, temperature controller 20 controls various airflow components (e.g., solenoid valves 34 and/or 36, mass flow controllers 110, 120 and/or 122, mixing valve 90, and/or pressure controller 140) to change the temperature within test chamber 12 from below ambient to above ambient, or vice versa, without removal of test article 14 from test chamber 12 or cessation of operation of test article 14 (e.g., continuous operation of test article 14 between below ambient and above ambient temperatures). Thus, for example, in the embodiment illustrated in FIG. 1, temperature controller 20 may actuate solenoid valve 34 and de-actuate solenoid valve 36 to provide an airflow to vortex tube 40 (while cessating an airflow to vortex tube 42) to elevate the temperature within test chamber 12. After a desired period of time, temperature controller 20 may de-actuate solenoid valve 34 and actuate solenoid valve 36 to provide an airflow to vortex tube 42 (while cessating an airflow to vortex tube 40) to reduce the temperature within test chamber 12. It should be understood that solenoid valves 34 and 36 may be concurrently actuated to provide varying levels of airflow to each of vortex tubes 40 and 42 to either elevate or reduce the temperature level within test chamber 12 without removal or cessation of operation of test article 14 during a temperature transition. Further, embodiments of the present invention enable a change in temperature within test chamber 12 from below an ambient temperature to above an ambient temperature, or vice versa, without connecting and/or disconnecting different heating/cooling equipment to test chamber 12 to transition between temperature extremes. For example, embodiments of the present invention enable a transition in temperature within test chamber 12 from below an ambient temperature to above an ambient temperature, or vice versa, without requiring a disconnection of a condenser/evaporator unit and the subsequent connection of a heating coil to transition between temperature extremes.

What is claimed is:

1. A vortex-based temperature control system, comprising:
   a chamber that at least partially encloses an optical transceiver or vertical cavity surface emitting laser (VCSEL) to be tested;
   a printed circuit board to which the optical transceiver or VCSEL is mounted, wherein the printed circuit board is configured to enable operation of the optical transceiver or VCSEL while the optical transceiver or VCSEL is at least partially enclosed within the chamber;
   a sensor disposed within the chamber for detecting a temperature within the chamber;
   a first vortex tube coupled to the chamber for providing a heating airflow to the chamber;
   a second vortex tube coupled to the chamber for providing a cooling airflow to the chamber;
   an air supply coupled to the first and second vortex tubes, wherein the air supply comprises:
      a booster configured to increase a pressure of an airflow deliverable to the first and second vortex tubes;
      a capacity tank coupled to receive an output of the booster and configured to store pressurized gas; and
      a pressure regulator coupled to receive an output of the capacity tank and configured to control the pressure of the airflow released downstream to the first and second vortex tubes; and
   a temperature controller coupled to the sensor and configured to control an airflow delivered to the first and second vortex tubes to obtain a desired temperature setting within the chamber.

2. The system of claim 1, further comprising at least one airflow control device controllable by the temperature controller to regulate an airflow delivered to at least one of the first and second vortex tubes.

3. The system of claim 1, further comprising a plurality of solenoid valves coupled to the temperature controller and each respectively coupled to the first and second vortex tubes, wherein actuation of at least one of the plurality of solenoid valves is controlled by the temperature controller to control the airflow delivered to the respective first and second vortex tubes.

4. The system of claim 1, further comprising a mass flow controller coupled to the temperature controller and controllable by the temperature controller to vary an airflow rate deliverable to at least one of the first and second vortex tubes.

5. The system of claim 1, further comprising a pressure controller coupled to the temperature controller and controllable by the temperature controller to control a volume of airflow deliverable to at least one of the first and second vortex tubes.

6. The system of claim 1, further comprising a plurality of pressure controllers coupled to the temperature controller and each respectively coupled to the first and second vortex tubes, wherein the temperature controller is configured to control the plurality of pressure controllers to control the airflow delivered to the respective first and second vortex tubes.

7. The system of claim 1, further comprising a mixing valve actuatable to control the airflow delivered to the first and second vortex tubes.

8. The system of claim 1, wherein the temperature controller is configured to control airflow delivered to the first and second vortex tubes to change a temperature within the chamber between an above-ambient temperature and a below-ambient temperature without cessation of testing the optical transceiver or VCSEL within the chamber.

9. The system of claim 1, wherein the temperature controller is configured to control airflow delivered to the first and second vortex tubes to change a temperature within the chamber between an above-ambient temperature and a below-ambient temperature without opening the chamber.

10. The system of claim 1, wherein the temperature controller comprises a proportional-integral-derivative (PI D) controller.

11. The system of claim 1, further comprising at least one muffler coupled to at least one of the first and second vortex tubes.

12. The system of claim 1, further comprising a chilling device disposed upstream along an airflow path from the second vortex tube.

13. A vortex-based temperature control system, comprising:
   a chamber that at least partially encloses an optical transceiver or vertical cavity surface emitting laser (VCSEL) to be tested;
   a printed circuit board to which the optical transceiver or VCSEL is mounted, wherein the printed circuit board is configured to enable operation of the optical transceiver or VCSEL while the optical transceiver or VCSEL is at least partially enclosed within the chamber;
   a sensor directly exposed to air within the chamber for detecting a temperature of the air within the chamber;

a vortex tube coupled to the chamber for providing an airflow to the chamber, the airflow comprising a heating airflow;

an air supply coupled to the vortex tube, wherein the air supply comprises:
  a booster configured to increase a pressure of the airflow deliverable to the vortex tube;
  a capacity tank coupled to receive an output of the booster and configured to store pressurized gas; and
  a pressure regulator coupled to receive an output of the capacity tank and configured to control the pressure of the airflow released downstream to the vortex tube;

a pressure controller located within an airflow path between the air supply and the vortex tube; and a temperature controller coupled to the sensor and the pressure controller, the temperature controller configured to control the pressure controller to control a rate of airflow delivered to the vortex tube to obtain a desired temperature setting within the chamber.

14. The system of claim 13, further comprising a valve disposed in the airflow path between the pressure controller and the vortex tube, the temperature controller configured to control actuation of the valve for providing an airflow to the vortex tube.

15. The system of claim 13, wherein an inlet to the vortex tube is coupled to an outlet of another vortex tube.

16. The system of claim 13, wherein the temperature controller comprises a proportional-integral-derivative (PI D) controller.

17. The system of claim 13, further comprising a chilling device disposed upstream along an airflow path from the vortex tube.

18. A vortex-based temperature control system, comprising:
  a chamber that at least partially encloses an optical transceiver or vertical cavity surface emitting laser (VCSEL) to be tested;
  a printed circuit board to which the optical transceiver or VCSEL is mounted, wherein the printed circuit board is configured to enable operation of the optical transceiver or VCSEL while the optical transceiver or VCSEL is at least partially enclosed within the chamber;
  a sensor directly exposed to air within the chamber for detecting a temperature of the air within the chamber;
  a vortex tube coupled to the chamber for providing an airflow to the test chamber, the airflow comprising a heating airflow;
  an air supply coupled to the vortex tube, wherein the air supply comprises:
    a booster configured to increase a pressure of the airflow deliverable to the vortex tube;
    a capacity tank coupled to receive an output of the booster and configured to store pressurized gas; and
    a pressure regulator coupled to receive an output of the capacity tank and configured to control the pressure of the airflow released downstream to the vortex tube;
  a mass flow controller located within an airflow path between the air supply and the vortex tube; and
  a temperature controller coupled to the sensor and the mass flow controller, the temperature controller configured to control the mass flow controller to control a rate of airflow delivered to the vortex tube to obtain a desired temperature setting within the chamber.

19. The system of claim 18, further comprising a valve disposed in the airflow path between the mass flow controller and the vortex tube, the temperature controller configured to control actuation of the valve for providing an airflow to the vortex tube.

20. The system of claim 18, wherein an inlet to the vortex tube is coupled to an outlet of another vortex tube.

21. The system of claim 18, wherein the temperature controller comprises a proportional-integral-derivative (PID) controller.

22. The system of claim 18, further comprising a chilling device disposed upstream along an airflow path from the vortex tube.

\* \* \* \* \*

UNITED STATES PATENT AND TRADEMARK OFFICE
CERTIFICATE OF CORRECTION

PATENT NO. : 8,820,095 B2  
APPLICATION NO. : 12/147366  
DATED : September 2, 2014  
INVENTOR(S) : Lessig et al.

Page 1 of 1

It is certified that error appears in the above-identified patent and that said Letters Patent is hereby corrected as shown below:

On the Title Page, in the Figure, delete Tag "10" and insert Tag -- $10_8$ --, therefor.

In the drawings

Fig. 8, Drawing Sheet 8 of 8, delete Tag "10" and insert Tag -- $10_8$ --, therefor.

In the specification

Column 1, Line 60, delete "test chamber 14" and insert -- test chamber 12 --, therefor.

Column 6, Line 62, delete ", thereby enabling" and insert -- . --, therefor.

Column 7, Lines 57-58, delete "chilling device 90." and insert -- chilling device 190. --, therefor.

Column 7, Line 58, delete "chilling device 90 may" and insert -- chilling device 190 may --, therefor.

Column 7, Line 60, delete "chilling device 90" and insert -- chilling device 190 --, therefor.

In the claims

Column 10, Line 48, Claim 10, delete "(PI D)" and insert -- (PID) --, therefor.

Column 11, Line 28, Claim 16, delete "(PI D)" and insert -- (PID) --, therefor.

Signed and Sealed this  
Twenty-ninth Day of December, 2015

Michelle K. Lee  
*Director of the United States Patent and Trademark Office*